United States Patent
Ye et al.

(10) Patent No.: US 6,724,649 B1
(45) Date of Patent: Apr. 20, 2004

(54) MEMORY CELL LEAKAGE REDUCTION

(75) Inventors: Yibin Ye, Portland, OR (US); Dinesh Somasekhar, Hillsboro, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/324,178

(22) Filed: Dec. 19, 2002

(51) Int. Cl.[7] .................. G11C 11/00; G11C 7/00
(52) U.S. Cl. ............. 365/154; 365/156; 365/203
(58) Field of Search ................... 365/154, 156, 365/203

(56) References Cited

U.S. PATENT DOCUMENTS

| | | | | |
|---|---|---|---|---|
| 5,410,506 A | * | 4/1995 | Ferrant et al. | 365/156 |
| 5,757,702 A | * | 5/1998 | Iwata et al. | 365/156 |
| 6,181,608 B1 | * | 1/2001 | Keshavarzi et al. | 365/156 |
| 6,373,760 B1 | * | 4/2002 | Ohbayashi | 365/156 |
| 6,552,925 B1 | * | 4/2003 | Brooks | 365/154 |
| 6,556,471 B2 | * | 4/2003 | Chappell et al. | 365/154 |

\* cited by examiner

Primary Examiner—Trong Phan
(74) Attorney, Agent, or Firm—John F. Travis

(57) ABSTRACT

Leakage current from non-selected memory cells is substantially eliminated by placing a negative voltage on the selection line of the non-selected cells. This negative voltage on the gate of the access transistors in the cells reduces the leakage current that would otherwise leak onto a shared sense line if the selection line were biased at 0 volts. In one embodiment the pre-charge voltage on the affected sense line is reduced so that the difference between the pre-charge voltage and the negative voltage does not exceed the design voltage of the transistors in the memory cells.

21 Claims, 6 Drawing Sheets

MEMORY CELL LEAKAGE REDUCTION

BACKGROUND

1. Technical Field

An embodiment of the invention relates generally to integrated circuits, and in particular relates to reducing leakage in memory circuits.

2. Description of the Related Art

Memory circuits are typically organized in a row and column matrix of memory cells, in which a line connecting a row of cells (e.g., a word line) and a line connecting a column of cells (e.g., a bit line) are both activated. The cell that is connected to both lines is thereby activated and may be read from or written into. The remaining cells do not have both of their connecting lines activated and therefore do not respond to attempts to read or write. In a read operation in a typical memory, the selected bit line is pre-charged (brought to voltage Vcc) before the selected word line is activated. When the word line is activated, the selected cell will pull down the voltage on the pre-charged bit line if the cell was storing a particular value (e.g., a logic 1), but will not pull down the voltage if the cell was storing the opposite value (e.g., a logic 0), thus permitting the stored value to be determined. Some memories use differential bit line sensing, in which a pair of bit lines is connected to the cells in a given column, and both bit lines are pre-charged. When the word line is activated, the selected cell will pull down the voltage on one of the two per-charged bit lines if a logic 0 is stored in the cell, while the cell will pull down the voltage on the other of the two pre-charged bit lines if a logic 1 is stored in the cell.

For both the single-ended and differential bit line arrangements, the non-selected cells may experience a low signal level on their (non-selected) word lines, and a high on the bit line that is not pulled down. This combination may cause the non-selected cells to experience a leakage current. Although the leakage current for a single cell may be small, the total leakage current for the entire column is equal to the sum of the leakage currents for all the non-selected memory cells (i.e., the total number of memory cells in the column–1). Since many cells may be connected in a column, this can represent a substantial amount of leakage current onto the bit lines. In the case of differential sensing it may interfere with the ability of the sensing circuits to detect the state of the selected memory cell, since the drive current from the selected cell must be detectably greater than the sum of the leakage currents for all the non-selected cells in the column.

BRIEF DESCRIPTION OF THE DRAWINGS

The invention may be understood by referring to the following description and accompanying drawings that are used to illustrate embodiments of the invention. In the drawings.

DETAILED DESCRIPTION OF THE INVENTION

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may, and a single embodiment may include the features, structures, or characteristics described herein for multiple embodiments.

Embodiments of the invention include a circuit to reduce leakage from storage cells and to improve the sensitivity of a bit-line sensing operation, by using reverse-biasing to reduce leakage and by reducing the pre-charge voltage so that the reverse-biasing does not create voltage differentials that might overstress the circuits. Although the described embodiments use a differential sensing arrangement in which the sensed voltage is the voltage between a pair of sense lines, the techniques described may also be used in single-ended sensing arrangements in which the sensed voltage is the voltage between a single sense line and a common signal ground.

Embodiments of the invention use a selection line to select a row in a row-column matrix of memory cells, and a sense line to both select a column in the matrix and to sense the stored state of a memory cell identified by the selected row and column. The terms "bit line" and "word line" are used to represent the sense line and selection line, respectively, in this document in a manner consistent with common industry practice regarding memory cell organization. However, these terms are used herein solely as a convenience to distinguish between the sense and selection lines of the memory circuits in familiar terms, and no limitation should be implied regarding the bit/word organization of the memory circuits described.

Figure 1:
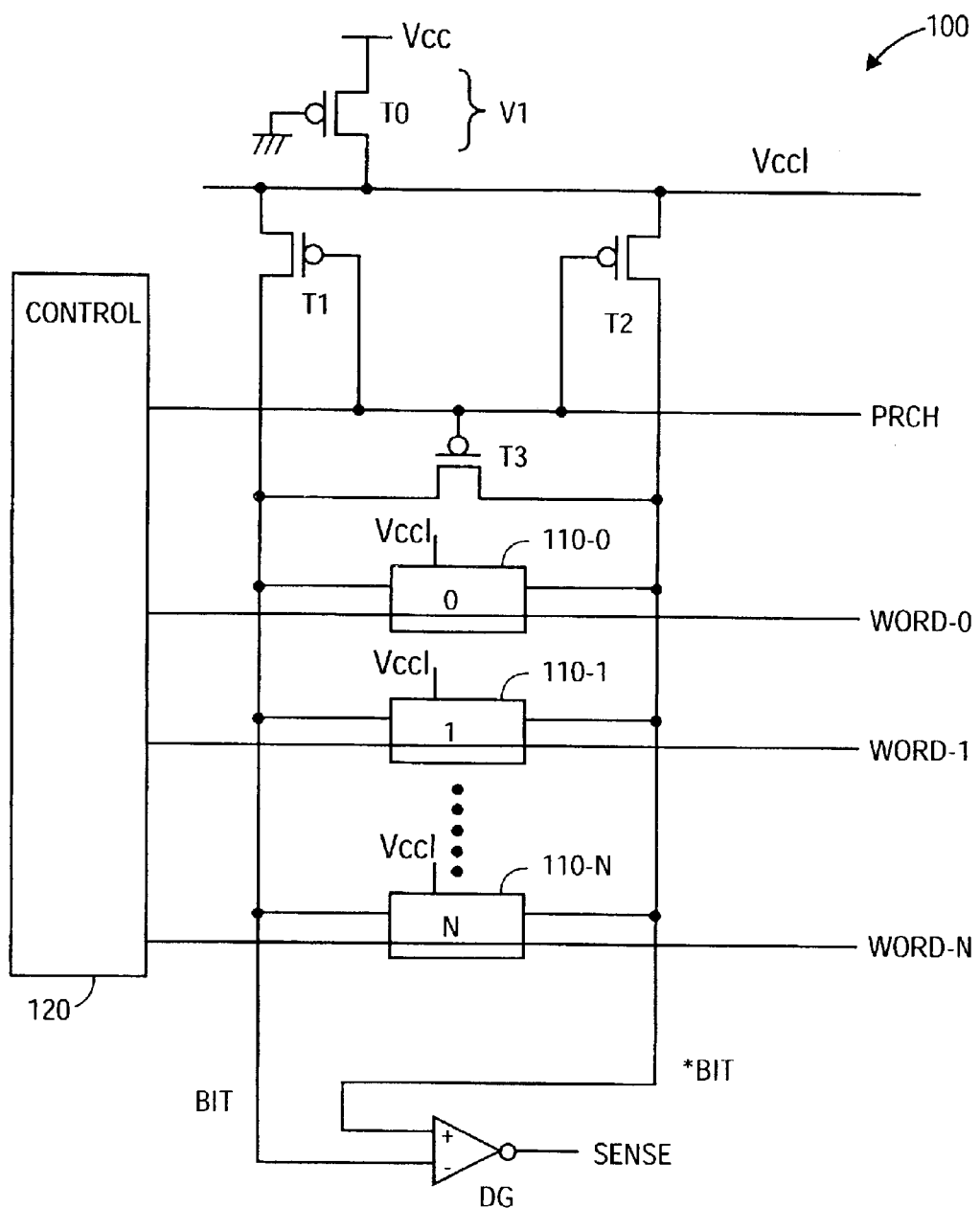
FIG. 1 shows a circuit for a column in a memory, according to one embodiment of the invention.

FIG. 1 shows a circuit 100 for a column in a memory, according to one embodiment of the invention. The memory may contain multiple such columns. The illustrated column includes multiple memory cells 110-0, 110-1, etc., through 110-N. Each cell is connected to an associated word line, labeled WORD-0 through WORD-N. The bit lines BIT and *BIT each connect to every cell in the column. Control logic 120 may selectively assert or deassert the line PRCH and each one of the word lines WORD-X at predetermined times to initiate a read operation from a selected cell in the column. (Note: the terminology YYY-X is used herein to denote any one of multiple items YYY-0,1,2, etc.) During a read operation, differential sense gate DG may be used to convert the resulting differential signals BIT and *BIT into a signal SENSE that represents the stored state of the selected cell that is being read. In a particular embodiment, the differential sense gate will produce a binary output signal SENSE whose state is determined by the polarity of the difference between the signals on the two inputs of the gate, with the output remaining in its current state if the difference between the two input signals is less than a predetermined threshold amount. Other embodiments may use other types of gates or circuits to convert the signal from the sense line into a binary signal.

Before reading, pre-charge transistor T1 may be turned on to pre-charge bit line BIT to the designated pre-charge voltage, while pre-charge transistor T2 may be turned on to pre-charge bit line *BIT to the designated pre-charge voltage. Equalization transistor T3 may be used to equalize the pre-charge voltages on BIT and *BIT, to prevent any unwanted difference between the two voltage levels that would degrade the differential sensing capabilities of the circuit. Pre-charge line PRCH may be used to simultaneously turn on pre-charge transistors T1 and T2 and equalization transistor T3 when the pre-charge operation is selected for the column.

Rather than connecting T1 and T2 to Vcc as in a conventional design, the illustrated embodiment of FIG. 1 connects T1 and T2 to Vccl. The circuit uses transistor T0 as a resistive divider to drop the voltage Vcc by an amount V1, resulting in the voltage Vccl=Vcc−V1. Thus, the pre-charge voltage delivered to BIT and *BIT is no greater than Vccl, and may even be reduced slightly below Vccl by a small voltage drop across T1 and/or T2. However, for simplicity of description the pre-charge voltage of BIT and *BIT is referred to herein as Vccl or approximately Vccl, with the understanding that in an actual circuit the pre-charge voltage may be slightly different than Vccl. In one embodiment, V1 is between 100 millivolts (mV) and 250 mV, but other values may also be used. Although a transistor is used as a voltage reduction circuit to create voltage drop V1 in the illustrated embodiment, other embodiments may use other techniques to reduce Vcc to Vccl for connection to the bit lines.

In one embodiment the non-selected word lines are driven to a negative voltage rather than to signal ground, while the selected word line is driven to Vcc. The negative voltage used on the non-selected word lines is referred to as −V2, where V1>=+V2. In one embodiment −V2 has a value of between about −100 mV and about −250 mV, but other values may also be used. When the access transistors of some of the non-selected memory cells experience a voltage of Vccl on their drain (due to the bit-line being high) and a voltage of 0 on their source (due to the particular memory cell storing a low on that side), placing the negative voltage −V2 on their gate reduces the leakage that would occur if the gate were at 0 volts. In one embodiment Vccl is also provided as a bias voltage to each memory cell 110-X so that the use of −V2 will not overstress the transistors in the memory cell. For example, the transistors in the memory cell may experience a maximum voltage differential of Vccl−(−V2)=Vcc, which is the permissible voltage differential they are designed for.

Transistors T0, T1, T2 and T3 are shown in FIG. 1 as PMOS transistors, but other embodiments may use other types of transistors, such as NMOS.

Figure 2:
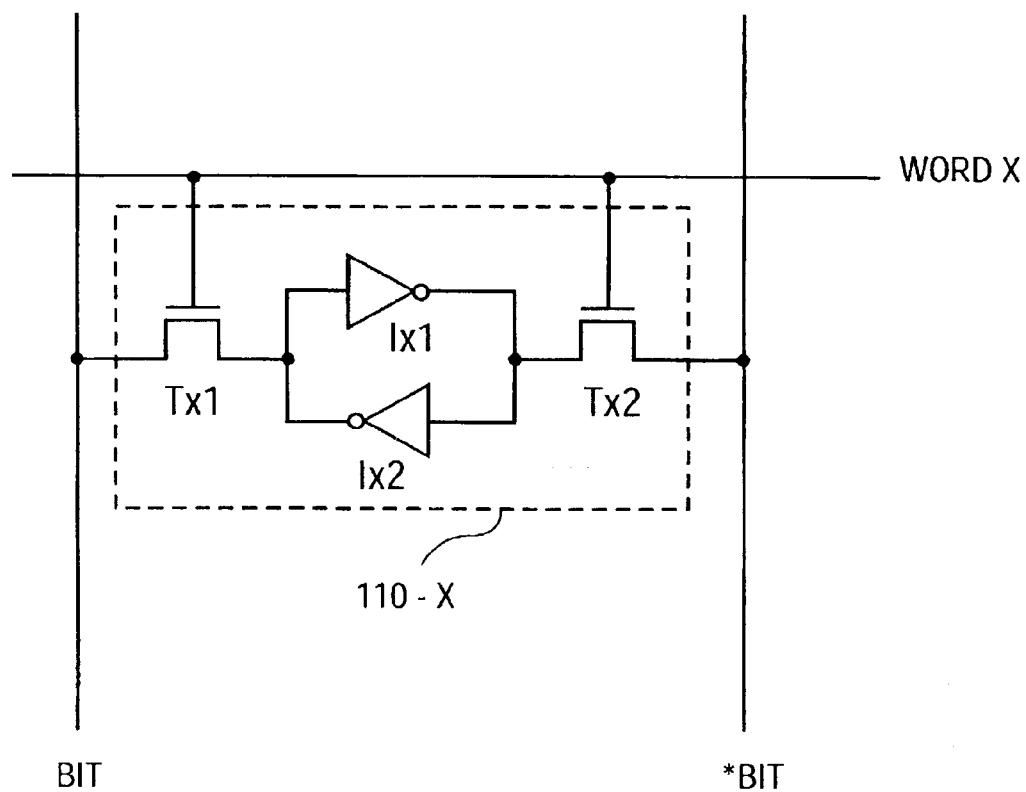
FIG. 2 shows a circuit of a memory cell, according to one embodiment of the invention.

FIG. 2 shows a circuit of a memory cell, according to one embodiment of the invention. The memory cell is labeled 110-X to indicate it may be any of memory cells 110-0 through 110-N in FIG. 1. In one embodiment, circuit 110-X is a typical 6-transistor memory cell in a Static Random Access Memory (SRAM) memory device, with inverters Ix1 and Ix2 being composed of two transistors each, but other circuit configurations may also be used. Access transistors Tx1 and Tx2 connect the inverters to the differential bit lines BIT and *BIT. The two inverters Ix1 and Ix2 form a binary storage cell. When Tx1 and Tx2 are both turned off, if the input to Ix1 is low, its output will be high, causing the input of Ix2 to be high and the output of Ix2 to be low. The two inverters are thus held in a first stable condition. Similarly, if the input to Ix1 is high, its output will be low, causing the input of Ix2 to be low and the output of Ix2 to be high, creating a second stable condition. These two stable conditions may represent the alternate states of a binary 0 and a binary 1. To write a value into the storage cell, one of the two access transistors may be turned on and connected to a low signal from the associated bit line to the input of the associated inverter, thus forcing the inverter pair into one of the two above-mentioned binary states. The other access transistor may be kept off, or the other bit line kept high, so that they do not affect the state of the inverter pair.

To read the value of the cell, both bit lines (BIT and *BIT) may be pre-charged to a high state (e.g., Vccl). When the word line WORD-X is subsequently activated, access transistors Tx1 and Tx2 are both turned on, connecting the output of Ix2 to BIT and connecting the output of Ix1 to *BIT. If the output of Ix2 is low, then BIT is pulled low through access transistor Tx1. Alternately, if the output of Ix1 is low, then *BIT is pulled low through access transistor Tx2. Since the configuration of the inverter pair requires that the output of Tx1 be the opposite of the output of Ix2, only one of the bit lines BIT and *BIT will be pulled low. A differential sense gate (e.g., DG of FIG. 1) may detect which bit line is pulled low, and the state of the memory cell is thus determined to be either a logic 0 or a logic 1. The translation of high/low states into a logic 0 or a logic 1 may be a matter of convention. In one convention a low on BIT and a high on *BIT represents a logic 1 with the opposite condition representing a logic 0, while in another embodiment a high on BIT and a low on *BIT represents a logic 1 with the opposite condition representing a logic 0.

With reference to both FIGS. 1 and 2, bit lines BIT and *BIT may be pre-charged to Vccl before word line WORD-X is activated. In the embodiment shown in FIG. 2, transistors Tx1 and Tx2 are NMOS transistors and WORD-X is activated by driving WORD-X high, but other embodiments may use other transistors and/or other signal techniques.

Figure 3:
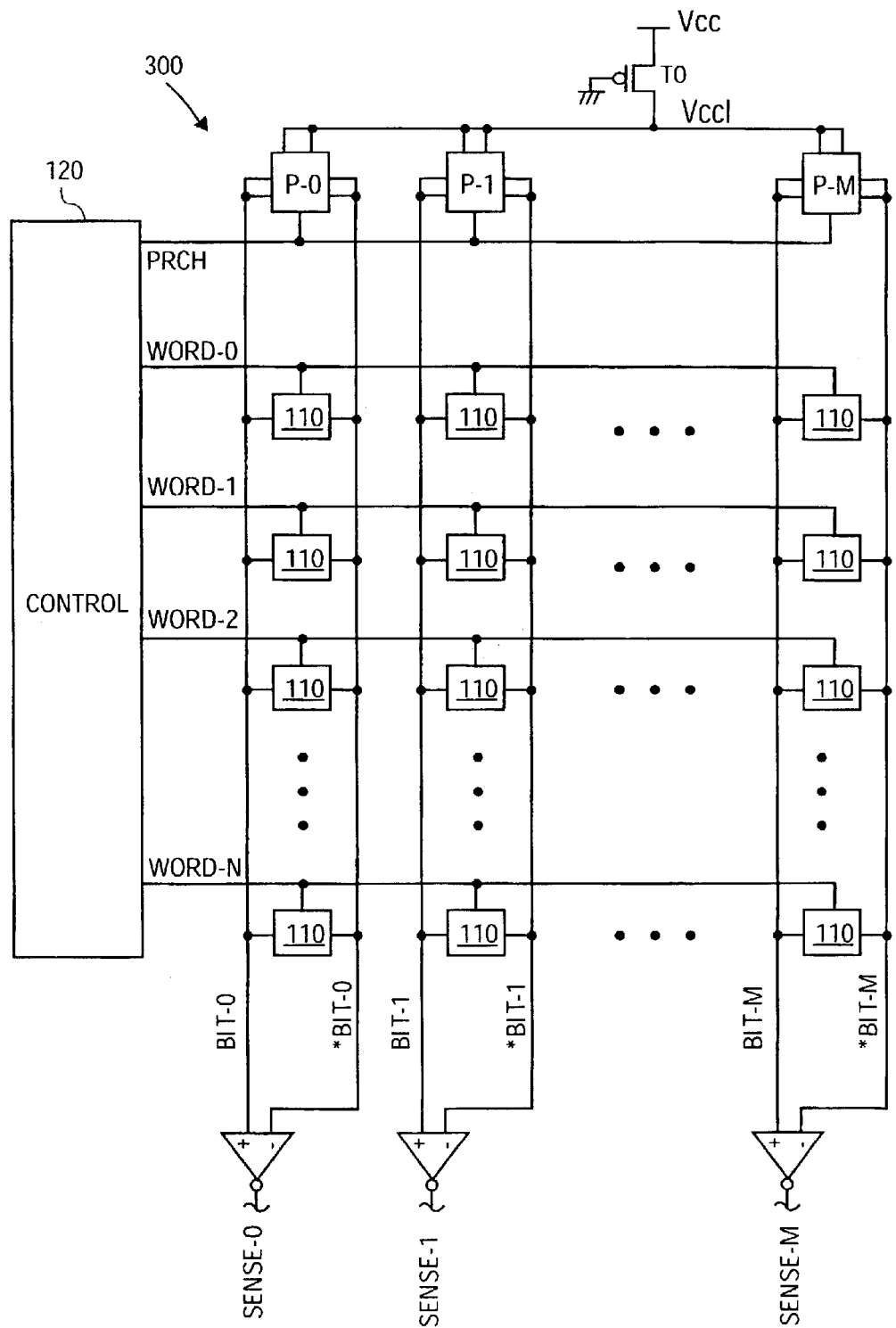
FIG. 3 shows a memory circuit comprising a matrix of multiple rows and multiple columns of memory cells, according to one embodiment of the invention.

FIG. 3 shows a memory circuit comprising a matrix of multiple rows and multiple columns of memory cells. In the illustrated embodiment, memory circuit 300 has memory cells arranged in rows 0–N and columns 0–M. Each column has differential sense lines BIT-X and *BIT-X, which may be connected to a sensing circuit, similar to that shown in FIG. 1, to generate a signal SENSE-X that corresponds to the stored state in the selected memory cell during a read operation on that particular column. Each column may also have a pre-charge circuit P-X (e.g., comprising transistors T1, T2 and T3 of FIG. 1), to pre-charge the individual bit lines of that column for a read operation. Control logic 120 asserts PRCH and/or WORD-X lines at the appropriate times as described elsewhere in this document.

In the illustrated embodiment, each of the BIT-X and *BIT-X lines for each of the columns 0–M receives the pre-charge voltage Vccl simultaneously when PRCH is asserted, and a memory cell in each of columns 0–M is selected by asserting a particular word line WORD-X. Thus, all the memory cells in a particular row may be read simultaneously by sensing their individual sense lines SENSE-0 through SENSE-M. However, other embodiments may have additional circuitry to permit selectively pre-charging less than all of the columns 0–M, so that less than all of the columns 0–M (e.g., only a single column) are read at one time.

The embodiment illustrated in FIG. 3 has a single transistor T0 to provide the voltage Vccl for all columns 0–M. However, other embodiments may have multiple such transistors to provide sufficient current capacity to pre-charge multiple columns simultaneously.

Figure 4:
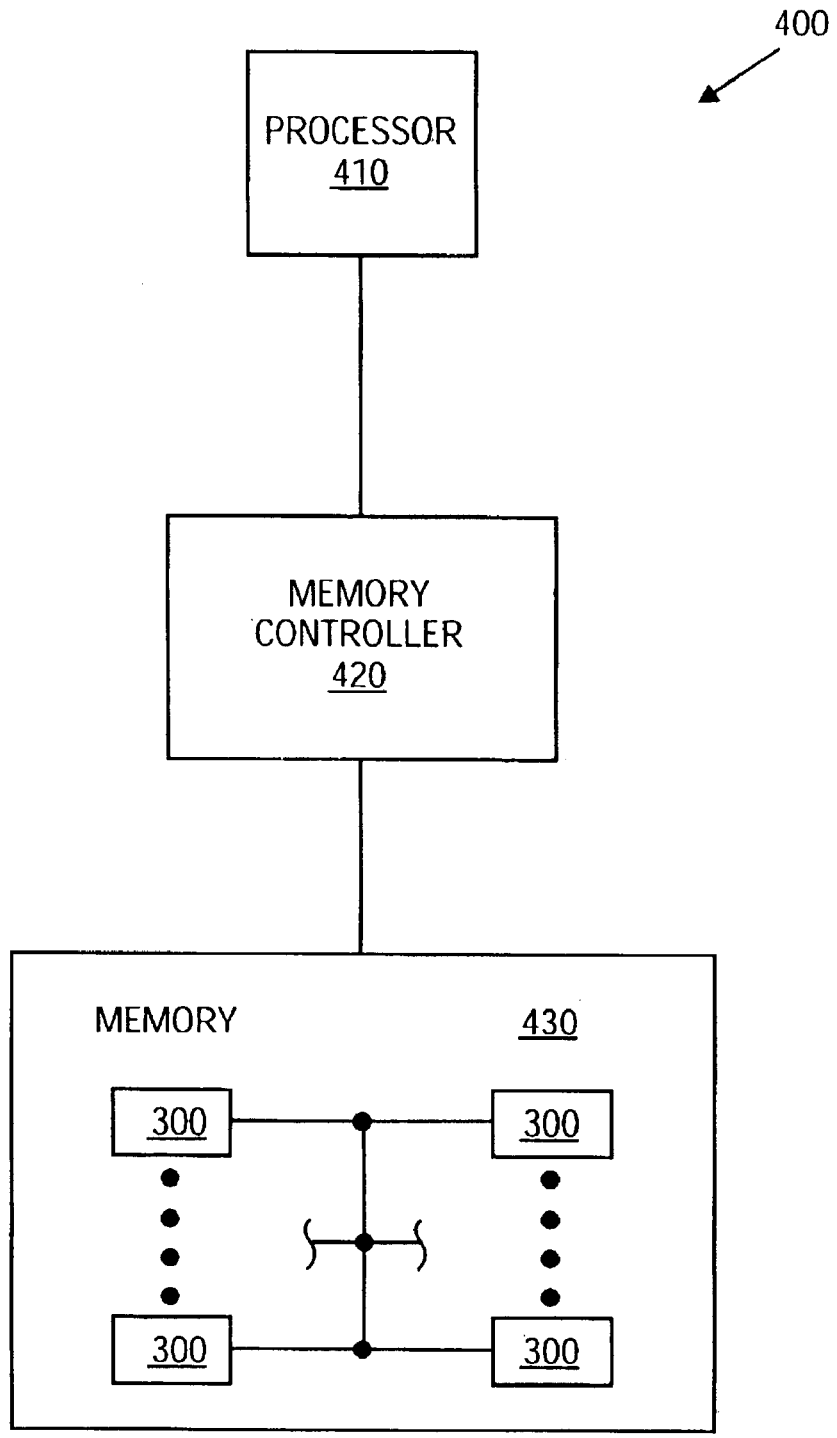
FIG. 4 shows a system comprising the memory circuit of FIG. 3, according to one embodiment of the invention.

FIG. 4 shows a system comprising the memory circuit of FIG. 3, according to one embodiment of the invention. In system 400, a processor 410 is coupled to a memory controller 420. The memory controller 420 controls, and is coupled to, a memory 430. System 400 may also comprise other devices and/or circuits not shown. In some embodiments, other devices and/or circuits may be connected between the memory controller 420 and the memory 430 and/or between the processor 410 and the memory controller 420, so that the aforementioned coupling may be indirect.

In one embodiment, memory 430 comprises multiple memory circuits 300 as shown in FIG. 3. The memory circuits 300 may be electrically connected in such a way that an individual memory circuit 300 may be addressed without addressing other memory circuits 300. Alternately, multiple memory circuits 300 may be simultaneously addressed without addressing all memory circuits in memory 430. Techniques for addressing memory circuits are well known and are not described in further detail herein, to avoid obscuring an understanding of the embodiments of the invention.

Figure 5:
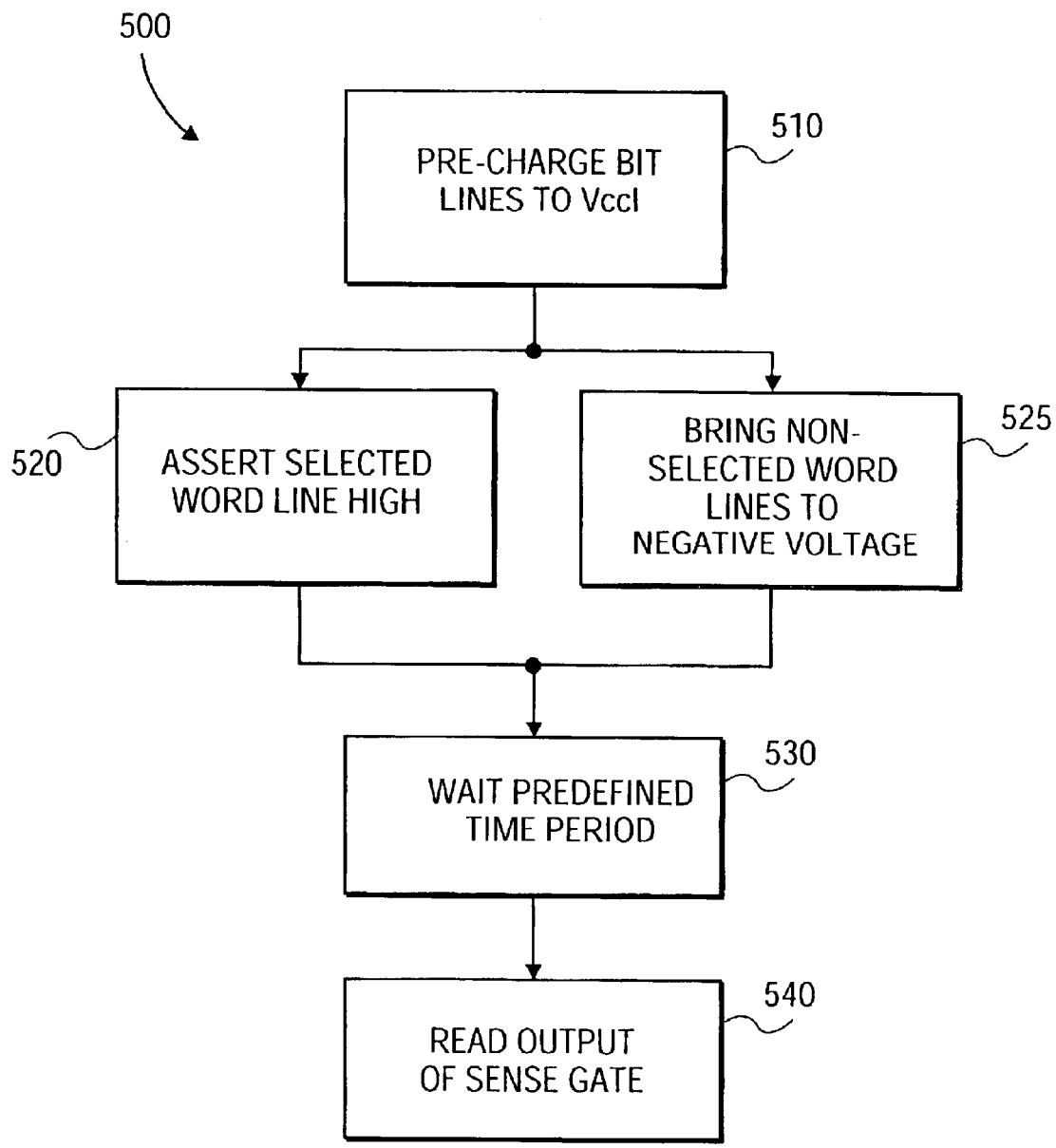
FIG. 5 shows a flow chart of a method of operating a memory circuit, according to one embodiment of the invention.
Figure 6:
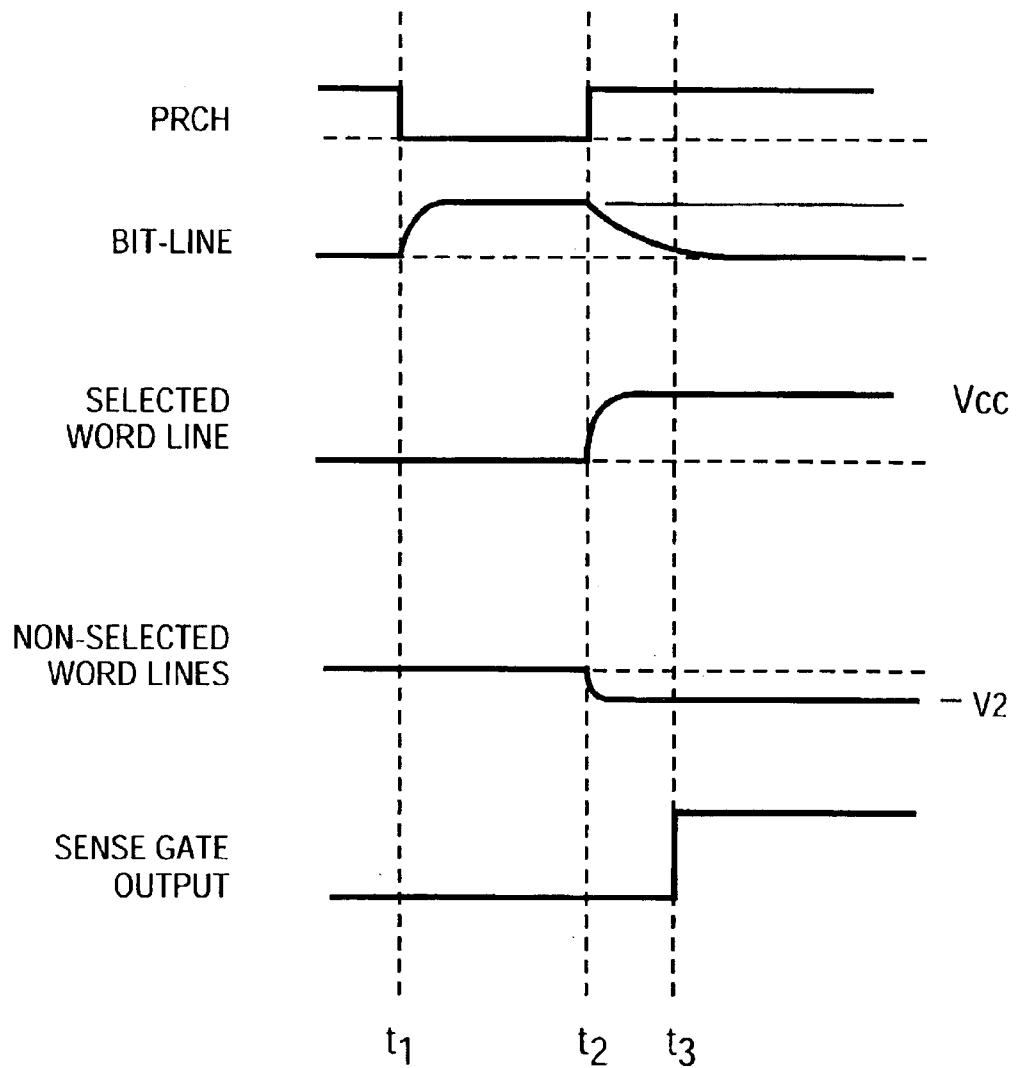
FIG. 6 shows a timing diagram of the method of operating described in FIG. 5, according to one embodiment of the invention.

FIG. 5 shows a flow chart 500 of a method of operating the memory circuit previously described, according to one embodiment of the invention. FIG. 6 shows a timing diagram of the method of operating described in FIG. 5, according to one embodiment of the invention. In FIG. 6, the horizontal axis represents time, with the vertical dashed lines indicating the times $t_1$, $t_2$ and $t_3$ at which various switching may occur. The horizonal dashed lines represent the low signal state (e.g., signal ground) for the various binary signals indicated. The following description makes reference to both FIG. 5 and FIG. 6.

At time $t_1$, the pre-charge line PRCH may be activated to initiate a pre-charging operation for a particular column of memory cells. PRCH is shown in FIG. 6 as being active in the low state and inactive in the high state to be compatible with the PMOS transistors T1, T2, and T3 shown in FIG. 1, but other embodiments may use other signal polarities. In response to PRCH being activated, the two differential bit lines for the particular column are pre-charged (e.g., to Vccl), as indicated at 510. After allowing sufficient time for the bit lines to be pre-charged, a selected word line may be asserted at 520 by driving it high at time 12. At the same time, the non-selected word lines that may affect the particular column may be driven to a negative voltage (e.g., −V2) at 525. When the selected word line is asserted, one of the two bit lines is discharged by the selected cell, thus pulling down the voltage on that bit line as shown. The other bit line may remain high. At 530, it may take a predefined amount of time for the differential between the discharging bit line and the non-discharging bit line to reach the threshold differential voltage of the sense gate, at which point the output of the sense gate may switch at time $t_3$ as shown. If the output of the differential sense gate is already in the proper state, it will remain unchanged at time $t_3$. At 540 the output of the sense gate may be read by other circuitry (not shown) to determine the stored state in the selected memory cell.

The foregoing description is intended to be illustrative and not limiting. Variations will occur to those of skill in the art. Those variations are intended to be included in the various embodiments of the invention, which are limited only by the spirit and scope of the appended claims.

What is claimed is:

1. An apparatus, comprising:

first and second memory cells;

a first sense line coupled to the first and second memory cells;

a first selection line coupled to the first memory cell and a second selection line coupled to the second memory cell;

a pre-charge circuit to charge the first sense line to a pre-charge voltage less than a supply voltage; and control logic to assert a signal on the first selection line responsive to the first memory cell being selected for a read operation and to couple a negative voltage onto the second selection line responsive to the second memory cell not being selected for the read operations;

wherein a difference between the pre-charge voltage and the negative voltage is no greater than a difference between the supply voltage and a signal ground voltage.

2. The apparatus of claim 1, wherein:

the negative voltage is to have a value of between approximately −100 millivolts and approximately −250 millivolts with reference to the signal ground voltage.

3. The apparatus of claim 1, wherein:

the pre-charge circuit is to produce the pre-charge voltage from the supply voltage.

4. The apparatus of claim 1, wherein:

the first memory cell comprises a first storage circuit; and a first access transistor coupled between the first storage circuit and the first sense line and having a first gate coupled to the first selection line; and the second memory cell comprises a second storage circuit; and a second access transistor coupled between the second storage circuit and the first sense line and having a second gate coupled to the second selection line.

5. The apparatus of claim 4, further comprising:

a second sense line in a differential sensing arrangement comprising the first and second sense lines;

wherein the first memory cell further comprises a third access transistor coupled between the first storage circuit and the second sense line and having a third gate coupled to the first selection line; and the second memory cell further comprises a fourth access transistor coupled between the second storage circuit and the second sense line and having a fourth gate coupled to the second selection line.

6. The apparatus of claim 5, wherein:

the pre-charge circuit is to charge the second sense line to the pre-charge voltage.

7. The apparatus of claim 1, wherein:

the sense line is a bit line.

8. The apparatus of claim 1, wherein:

the selection line is a word line.

9. The apparatus of claim 1, wherein:

the memory cells are static random access memory cells.

10. An apparatus, comprising:

a memory device having memory cells electrically connected in a matrix defined by sense lines and selection lines;

a pre-charge circuit to place a pre-charge voltage on a particular one of the sense lines;

control logic to place a first voltage having a first polarity on a particular one of the selection lines to read a particular memory cell and to place a second voltage having a second polarity opposite the first polarity on remaining ones of the selection lines;

wherein a difference between the first voltage and the second voltage is no greater than a difference between the supply voltage and a signal ground voltage.

11. The apparatus of claim 10, wherein:

the first voltage is a positive voltage and the second voltage is a negative voltage.

12. The apparatus of claim 10, wherein:

the pre-charge voltage is less than a supply voltage used by the memory device.

13. The apparatus of claim 10, wherein:

each of the sense lines is to use a differential sensing arrangement.

14. A system, comprising:

a processor;

a memory controller coupled to the processor;

a memory coupled to the memory controller and comprising
  a plurality of memory cells;
  a sense line coupled to the plurality of memory cells;
  a first selection line coupled to a first memory cell of the plurality of memory cells;
  a second selection line coupled to a second memory cell of the plurality of memory cells;
  a pre-charge circuit to charge the sense line to a pre-charge voltage; and
  control logic to couple the supply voltage onto the first selection line responsive to the first memory cell being selected for a read operation and to reverse-bias the second memory cell responsive to the second memory cell not being selected for the read operations;

wherein a difference between the pre-charge voltage and a reverse-bias voltage used on the second memory cell is no greater than a difference between the supply voltage and a signal ground voltage.

15. The system of claim 14, wherein:

the control logic is to reverse-bias the second memory cell by placing a negative voltage on the second selection line.

16. The system of claim 15, wherein:

the negative voltage is to have a value of between approximately −100 millivolts and approximately −250 millivolts with reference to the signal ground voltage.

17. The system of claim 14, wherein:

the sense line is to use a differential sensing arrangement.

18. The system of claim 14, wherein:

the pre-charge circuit comprises a voltage-reduction circuit to produce the pre-charge voltage from the supply voltage.

19. A method, comprising:

pre-charging a sense line in a memory;

placing a positive voltage on a first selection line in the memory to select a first memory cell for a read operation;

placing a negative voltage on a second selection line in the memory to reverse-bias a second memory cell that is not selected for the read operation; and reading a stored state from the first memory;

wherein a difference between the pre-charge voltage and the negative voltage is no greater than a difference between the supply voltage and a signal ground voltage.

20. The method of claim 19, wherein:

said pre-charging comprises placing a pre-charge voltage on the sense line that is less than a supply voltage to the memory.

21. The method of claim 19, wherein:

said reverse-biasing substantially reduces current leakage from the second memory cell to the sense line.

* * * * *

UNITED STATES PATENT AND TRADEMARK OFFICE
CERTIFICATE OF CORRECTION

PATENT NO. : 6,724,649 B1 Page 1 of 1
DATED : April 20, 2004
INVENTOR(S) : Ye et al.

It is certified that error appears in the above-identified patent and that said Letters Patent is hereby corrected as shown below:

Column 4,
Line 24, delete "Tx1" and insert -- Ix1 --.

Column 5,
Line 50, delete "12" and insert -- $t_2$ --.

Column 6,
Line 19, delete "operations" and insert -- operation --.

Column 7,
Line 40, delete "operations" and insert -- operation --.

Signed and Sealed this

Twelfth Day of October, 2004

JON W. DUDAS
*Director of the United States Patent and Trademark Office*